United States Patent [19]

Sugimoto et al.

[11] Patent Number: 4,912,394
[45] Date of Patent: Mar. 27, 1990

[54] ATTENUATOR CIRCUIT

[75] Inventors: Yasuhiro Sugimoto, Yokohama; Hiromi Mafune, Sagamihara, both of Japan

[73] Assignee: Kabushiki Kaisha Toshiba, Kawasaki, Japan

[21] Appl. No.: 355,610

[22] Filed: May 23, 1989

[30] Foreign Application Priority Data

Jun. 2, 1988 [JP] Japan .................................. 63-136541

[51] Int. Cl.⁴ .............................................. G05F 3/00
[52] U.S. Cl. .................................. 323/354; 333/81 R
[58] Field of Search ..................... 323/353, 354, 297; 333/81 R; 307/264

[56] References Cited

U.S. PATENT DOCUMENTS 1,912,719  6/1933  Nicolas ................................. 323/354
4,238,724 12/1980  Klaus ................................... 323/354
4,280,089  7/1981  Van De Plassche et al. ...... 323/354

FOREIGN PATENT DOCUMENTS

864266  9/1981  U.S.S.R. .............................. 323/354

Primary Examiner—William H. Beha, Jr.
Attorney, Agent, or Firm—Finnegan, Henderson, Farabow, Garrett and Dunner

[57] ABSTRACT

An attenuator circuit is provided which comprises an input node, a first resistor connected at one terminal to a reference potential, a second resistor connected to the other terminal of the first resistor, a first output node which is a connection node of the first resistor and the second resistor, a third resistor connected in parallel with the series circuit of the first and second resistors and being of such a type that a resultant resistive value of the first, second and third resistors is equal to a resistive value of the first resistor, a fourth resistor connected at one terminal to a connection node of the second and third resistors and having a resistive value substantially equal to that of the second resistor, and at least one combination resistor of a ladder configuration connected between the other terminal of the fourth resistor and the input node and having a third output node as a junction of its series circuit portion.

17 Claims, 8 Drawing Sheets

ATTENUATOR CIRCUIT

BACKGROUND OF THE INVENTION

1. Field of the Invention

The present invention relates to an attenuator circuit and, in particular, to a multi-tapped attenuator circuit made up of a semiconductor device and used, in particular, as an electronic volume control for audio devices.

2. Description of the Related Art

Figure 5:
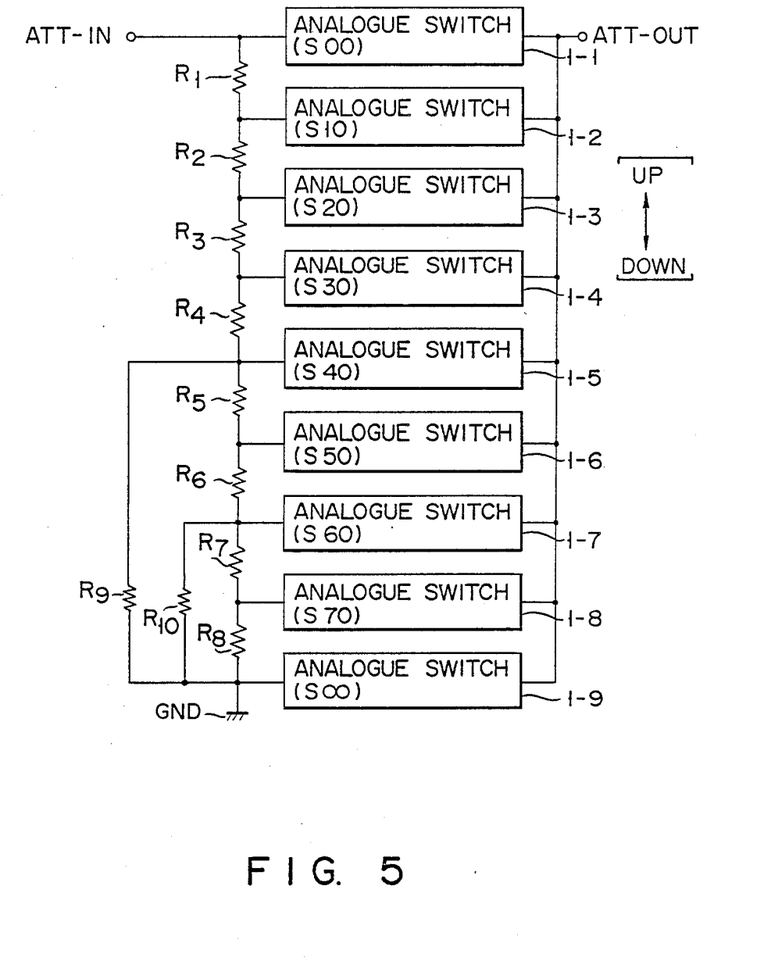
FIG. 5 is a circuit arrangement showing a conventional attenuator circuit.

FIG. 5 shows a conventional attenuator circuit which is employed as a volume control for audio devices with the use of a digital processing technique. The attenuator circuit comprises series resistor circuits R1 to R8 and parallel resistor circuits R9 and R10. Here, resistors R9 and R10 are expressed as $$R9 << \{R5+R6+R10//(R7+R8),$$

noting that the symbol "//" means that the resistor R10 is connected in parallel with the resistors R7+R8, and $$R10 << (R7+R8).$$

In this case, an amount of attenuation of the attenuator circuit is determined by a resistance ratio of R1 to R4 and R9 and that of R5 and R6 and R10. In FIG. 5, 1-1, 1-2, ... show analogue switches of which only one is selectively closed, ATT-IN and ATT-OUT denoting a signal input terminal and signal output terminal, respectively.

Figure 8:
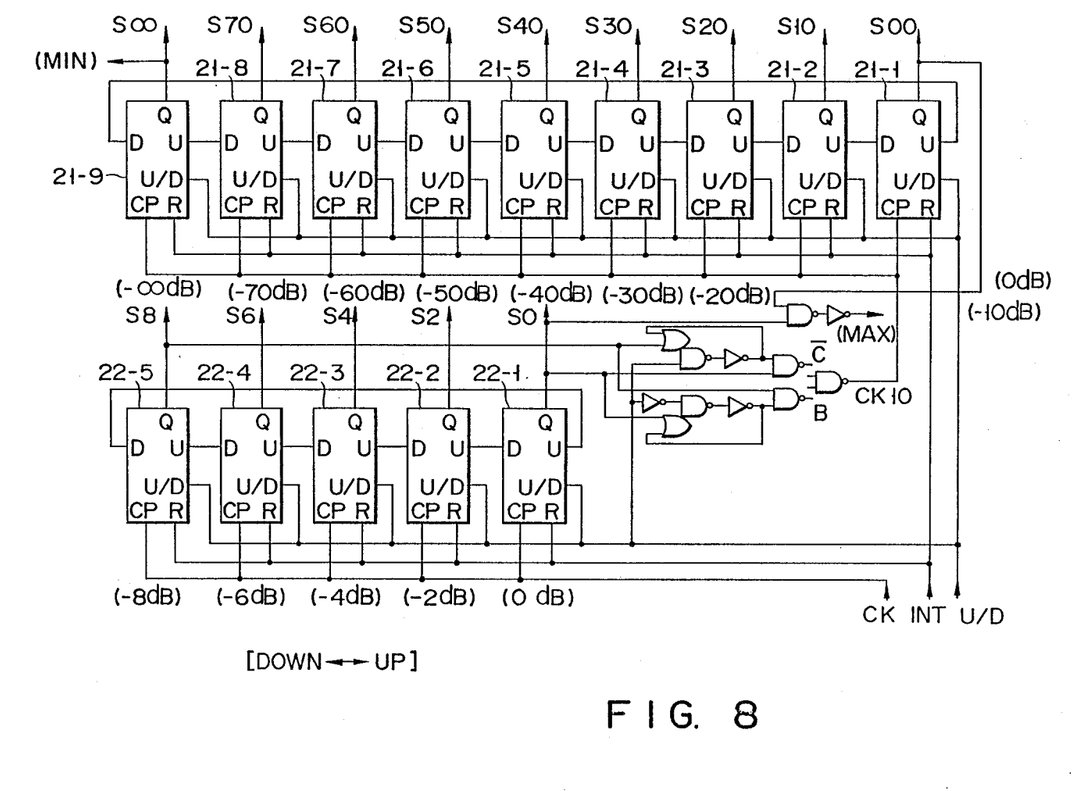
FIG. 8 is a circuit arrangement showing a shift register for controlling an analogue switch array.

Analogue switches 1-1~1-9 (S00 to S∞) are supplied with one of signal S∞~S00 from a logic circuit and only one of them is turned ON to determine a volume level for audio devices. That is, one resistor circuit is selected by the turned-ON analogue switch 1 to determine an amount of attenuation. A logic circuit of FIG. 8 is controlled by a volume switch external to an audio device, not shown. In this case, a maximum volume level is obtained at an attenuation of zero upon selection of the switch 1-1 (S00). When the switches 1-2, 1-3, ... are sequentially switched, then a corresponding volume level is decreased with an increasing attenuation level, leading to a zero volume at a maximum attenuation level upon selection of the switch 1-9 (S00).

Figure 6A:
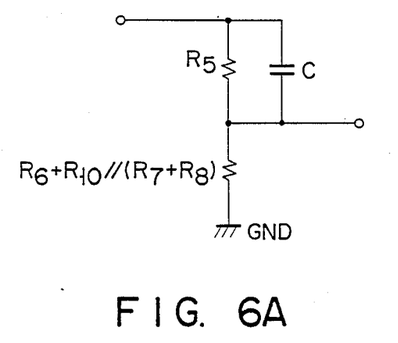
FIGS. 6A and 6B are a portion of an equivalent circuit of the attenuator circuit shown in FIG. 5.
Figure 6B:
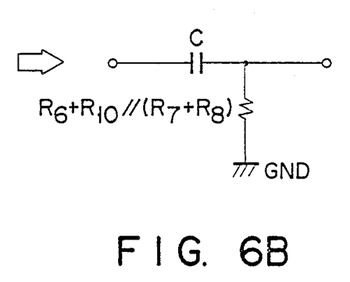

Now let it be assumed that an output is taken from a junction node of the resistors R5 and R6 in a conventional circuit arrangement. Stated in terms of alternating current, a highpass filter is formed, comprising a capacitor c across a pin and a resultant resistance $$R6+R10//(R7+R8)$$

on a reference potential (ground) side, as shown in Figs. A and B, which is situated relative to an output terminal. In this case, the resistor R5 is ignored in the case of a high frequency wave. The frequency characteristic of the filter is determined by the cutoff frequency of $f=\frac{1}{2}\pi CR$ where R=a resultant resistance. Here a resistance corresponding to R at a junction node of the resistors R4 and R5 is 1.0 kΩ and, similarly, a resistance corresponding to R at a junction node of the resistors R5 and R6 is 3.16 kΩ, a value which is greater than the aforementioned resistance at the preceding stage seen looking from a ground terminal side.

Figure 7:
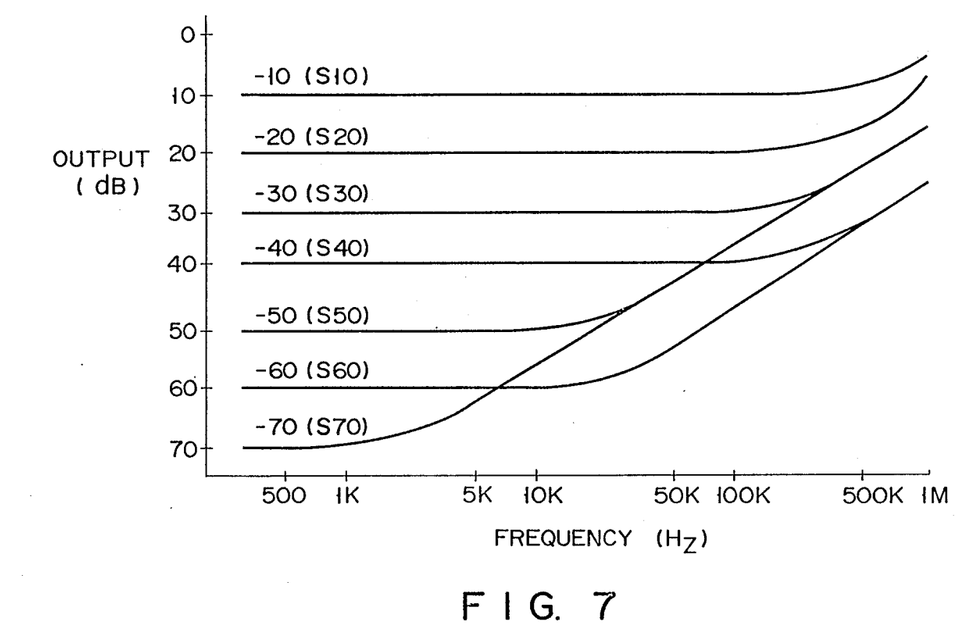
FIG. 7 is a graph showing the characteristic of the attenuator circuit of FIG. 5.

However, the following problem arises from such a resistance relation. FIG. 7 shows the frequency characteristic of the attenuator circuit when the switches 1-2 ~1-8 (S10~S70) are selected, respectively. At this time, the frequency characteristics of the switches 1-6 (S50) and 1-8 (S70), at a time of switching, in a graph shown in FIG. 7 reveal unduly high levels at a high frequency zone of over 5 kHz. This may be ascribed to the aforementioned resistance relation. The unbalance of the frequency characteristic may pose a problem, such as the volume of a highpass zone becomes louder at the time of a volume control in the audio device in spite of narrowing down a volume range. Thus the circuit of FIG. 5, that is, the attenuator of FIG. 5, is not adequate as an attenuator circuit because the area of the resistors R4~R10 is not preferable in a high frequency zone.

Furthermore, if various resistors of a varying value are provided in a common IC, a variation occurs in parts of an associated circuit and hence those resistive components in the IC take a greater occupation area.

SUMMARY OF THE INVENTION

An object of the present invention is to provide an attenuator circuit which has an accurate attenuation ratio by suppressing, for example, an unbalance of attenuation at a high frequency zone.

Another object of the present invention is to provide an attenuator circuit in which resistive components have less occupation area.

According to the present invention an attenuator circuit is provided which comprises an input terminal (ATT-IN), a first resistor (R18) connected at one terminal to a reference potential (CND), a second resistor (R17) connected in series with the other terminal of the first resistor (R18), a first output terminal (a) which a connection node of the first resistor (R18) and second resistor (R17), a third resistor (R21) connected in parallel with the series circuit of the first and second resistors (R18, R17) and being of such a type that a resultant resistive value of the parallel circuit of the first, second and third resistors (R18, R17, R21) is substantially equal to a resistive value of the first resistor (R18), a fourth resistor (R16) connected to a connection node of the second and third resistors (R17, R21) and having a resistive value substantially equal to that of the second resistor (R17), a second output terminal (c, d) which is a connection node between the resistor (R16) and the parallel circuit of the resistors (R18, R17, R21), and at least one combination resistor of a ladder configuration connected between the input terminal (ATT-IN) and the other terminal of the resistor (R16) and having an output terminal as a junction formed between said input node (ATT-IN) and the combination resistor (R20, 15, 19, 14).

That is, the present invention provides an attenuator circuit which suppresses, for example, a unbalance of an attenuation ratio at a high frequency zone by providing at least one combination resistor of a ladder configuration near a reference potential (GND) side.

DETAILED DESCRIPTION OF THE PREFERRED EMBODIMENTS

An attenuator circuit according to the embodiments of the present invention will be explained below.

Figure 1:
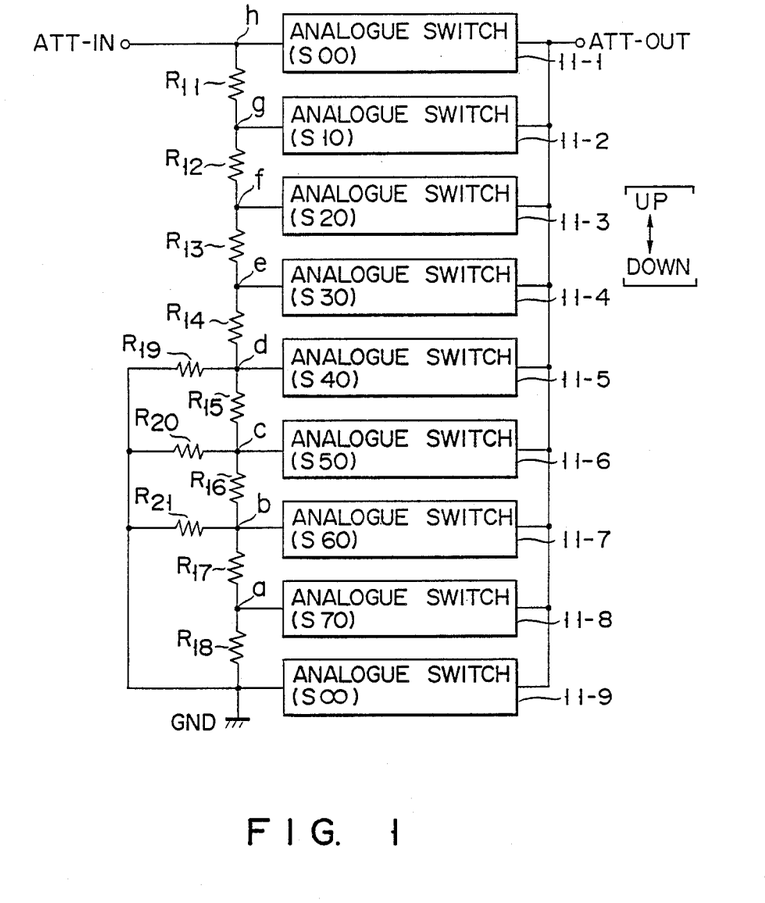
FIG. 1 is a circuit arrangement showing an attenuator circuit according to one embodiment of the present invention.

FIG. 1 is a circuit arrangement showing the attenuator circuit of the present invention. A resistor R18 is connected at one terminal to ground GND and at the other terminal to a resistor R17 in a series array to obtain a resistance ratio for achieving an arbitrary attenuation level. A junction of the resistors R17 and R18 is taken as an output terminal a. A resistor R21 is connected in parallel with the resistors R17 and R18. A resultant resistive value of the parallel circuit of the resistors R21 and R17 and R18 is set to a resistive value of the resistor R18. A resistor R16 having the same value as that of the resistor R17 is connected in series with the parallel circuit of the resistors R1 and R18 and R21. An output terminal a is situated at a junction node between the resistors R17 and R18. An output terminal b is situated at a junction node between the resistor R16 and the parallel circuit of the resistors R17 and R18 and R21. From the ground terminal GND toward an input terminal ATT-IN, a parallel circuit of resistors R20 and R15 and that of resistors R19 and R14 are stacked as a ladder configuration with the junction node of the resistors R20 and R15 taken as an output terminal c and that of the resistors R19 and R14 taken as an output terminal d.

From the parallel circuit of the resistors R19 and R14 toward the input terminal ATT-IN, a series circuit of R13, R12 and R11 is connected in that order with the junction node of the resistors R14 and R13 taken as an output terminal e, that of the resistors R13 and R12 as an output terminal f and that of the resistors R12 and R11 as an output terminal g. One terminal h of the resistor R11 is connected to the input terminal ATT-IN. The output terminals a, . . . , h are connected respectively through analogue switches 11-1, . . . , 11-9 to an output terminal ATT-OUT.

Here, the ladder configuration is shown, for example, as the resistors R20 and R15 and resistors R19 and R14 and those resistors connected in the ladder configuration are referred to as ladder-connected resistors.

An explanation will be given below of the case where a resultant resistance of the aforementioned attenuator circuit is 100 kΩ, an attenuation step is −10 dB and a whole amount of attenuation as set from the input ATT-IN side is 0 dB∼70 dB. Let it be assumed that R11 =68.4 kΩ, R12=21.6 kΩ, R13=6.84 kΩ, R14 to R17=2.16 kΩR19∼R21=1.46 kΩ and R18=1.00 kΩ. The ladder resistors R14 and R19, R15 and R20, and R16 and R21 and a resultant resistance of the parallel circuit of R21 and R17 and R18 is set to a resistance of the resistor R18.

FIG. 7 is a graph showing a result of simulation when, in the circuit shown in FIG. 5, R1=68.0 kΩ, R2=22.3 kΩ, R3=6.95 kΩ, R4=2.12 kΩ, R5=6.84 kΩ, R6=2.16 kΩ. R7=6.84 kΩ, R8=3.16 kΩ and R9=R10=1.11 kΩ. From the graph it will be seen that −50 dB and −70 dB show the lower output levels of the resistors R9=R10=1.11 kΩ. This reveals an unbalance in a high-frequency zone relating to a cut-off frequency f=½πCR.

Figure 2:
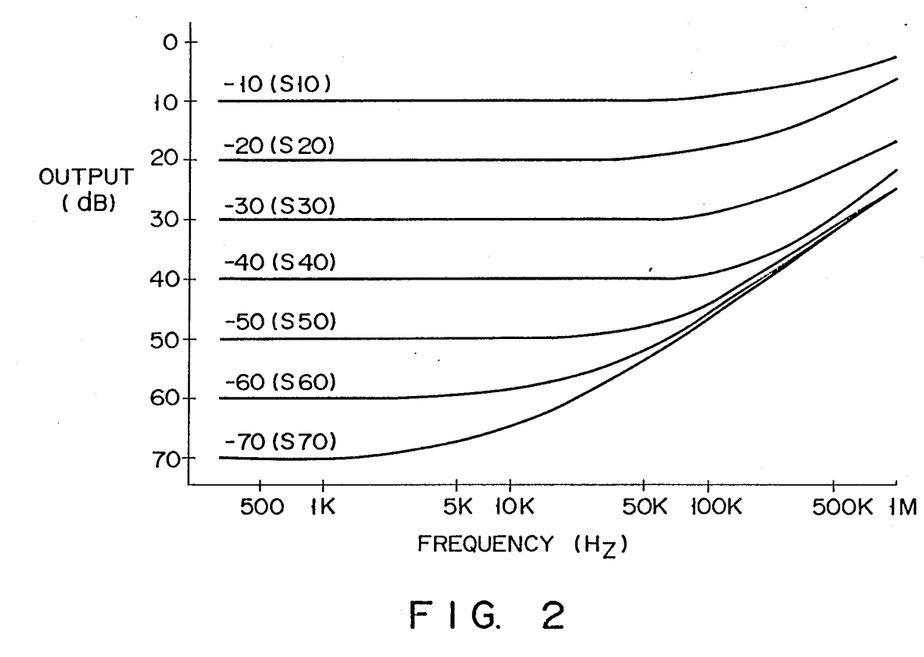
FIG. 2 is a graph showing the frequency characteristic of the attenuator circuit of FIG. 1.

FIG. 2 is a graph showing a result of simulation when the ladder-connected resistors of FIG. 1 are employed. From this graph it will be seen that there is no unbalance of the frequency characteristic at a high frequency zone corresponding to −50 dB and −70 dB. Since, with the use of the ladder-connected resistors, R (each resultant resistance at nodes b∼d) in the cutoff frequency f=½πCR takes on the same value corresponding to a resistance of the resistor R18, there is no variation in the attenuation ratio, such as the unbalance of the frequency characteristic.

Furthermore, the resultant resistance is 120.59 kΩ for the case shown in FIG. 7 and 110.86 kΩ for the case shown in FIG. 1 which is smaller than that in the case of FIG. 1.

Figure 3:
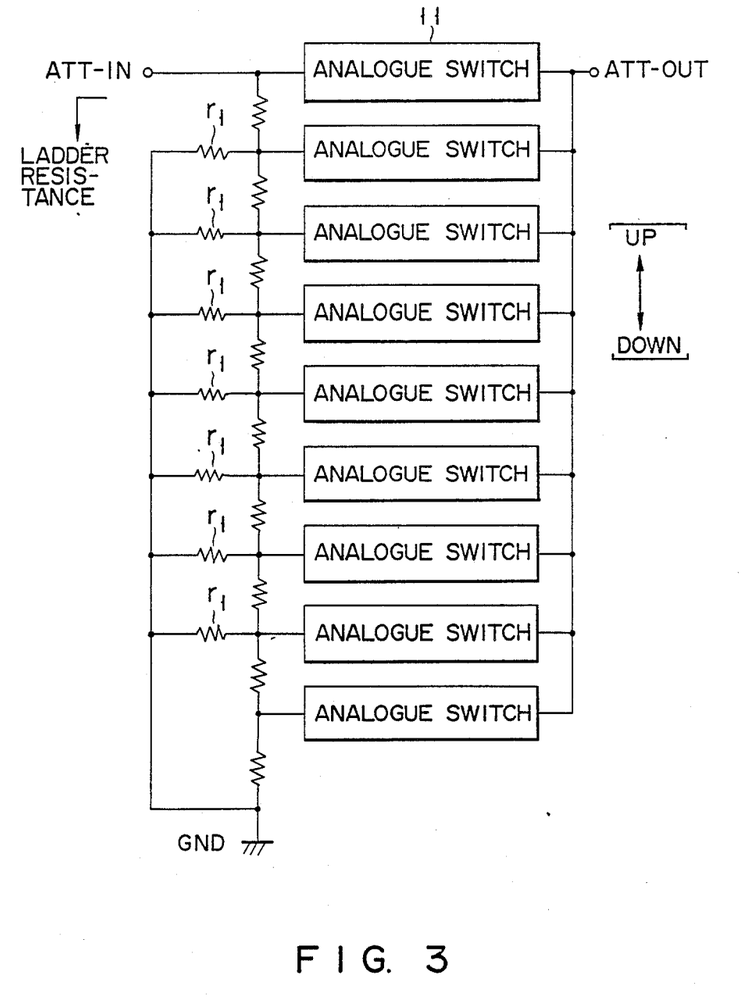
FIG. 3 is a circuit arrangement showing an attenuator circuit according to another embodiment of the present invention.
Figure 4:
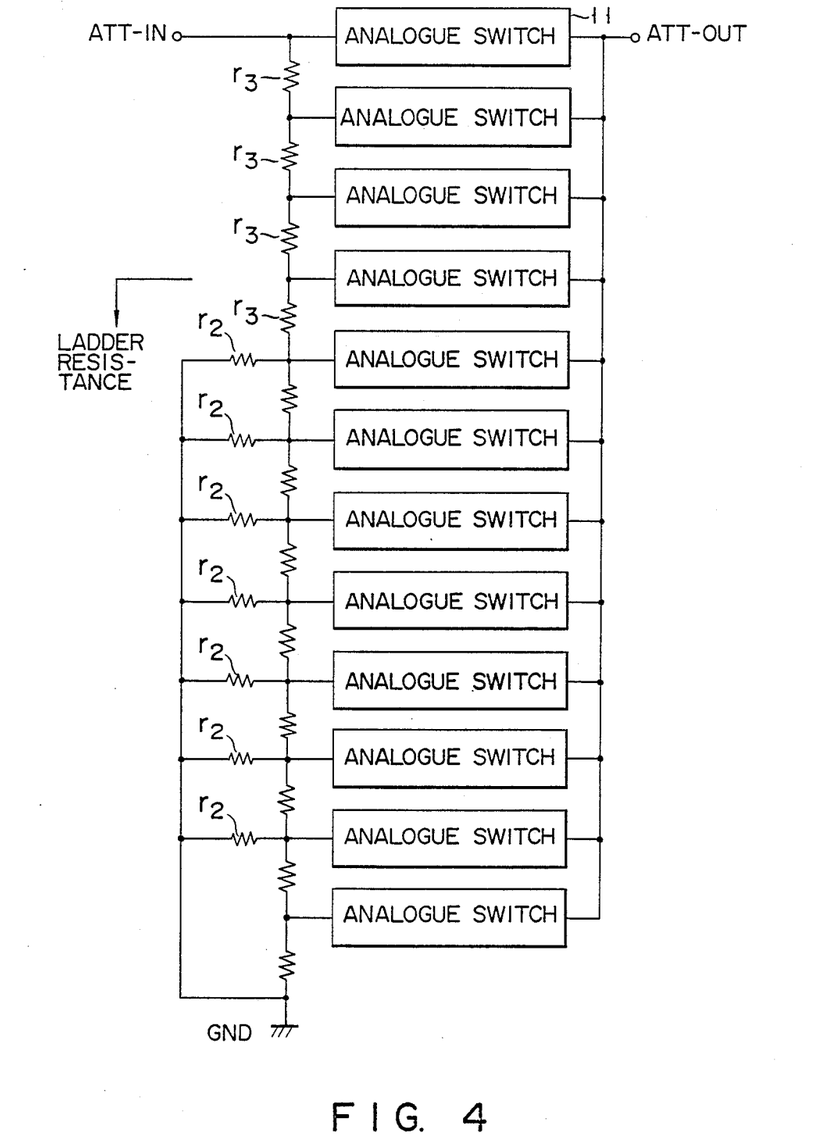
FIG. 4 is a circuit arrangement showing an attenuator circuit according to another embodiment of the present invention.

FIGS. 3 and 4 show another embodiment of the present invention, the embodiment of FIG. 3 showing resistors r1, r1, . . . , r1 in a ladder configuration from a terminal ATT-IN toward a terminal ATT-OUT and the embodiment of FIG. 4 similarly showing resistors r2, r2, . . . , r2 in a ladder configuration and including a series circuit of resistors r3, r3, . . . , that is, an example having more attenuation steps.

According to the present invention, it is possible to reduce an occupation area on an IC unit by making a total resistance of resistors relatively small. Furthermore, no excessively great resistance ratio is created between the input terminal side and the reference potential side and hence an accurate attenuation ratio can be obtained, for example, by employing sheet resistances alone so that the resistance ratio may greatly not vary.

An external control circuit will be explained below in connection with control signals (S∞ ∼ S00) which are supplied to analogue switches in the attenuator circuit of the present invention.

FIG. 8 is a circuit diagram showing a shift register circuit (a logic circuit) which supplies control signals (S∞ ∼ S00) to analogue switches in the attenuator circuit of the present invention. The shift register circuit includes flip-flop circuits 21-1 . . . 21-9 and 22-1 . . . 22-5 which are supplied with a signal U/D from an external volume switch,.not shown. In FIG. 8, INT and CL are an initializing signal and clock signal, respectively, which are supplied to a reset terminal R and clock terminal Cp, respectively, of the flip-flops in the shift register circuit. The output signals (S00∼S∞) of the counter 21 are supplied to the analogue switches 11-1∼11-9, respectively, in the attenuator circuit shown in FIG. 1.

The shift register circuit detects the pulse signals U/D from the external volume switch and counts them. In accordance with the number of pulse signals, any one of the control signals S00∼S∞ is delivered as an output signal to control the analogue switches 11-1∼11-9 in the attenuator circuit of the present invention.

Figure 9:
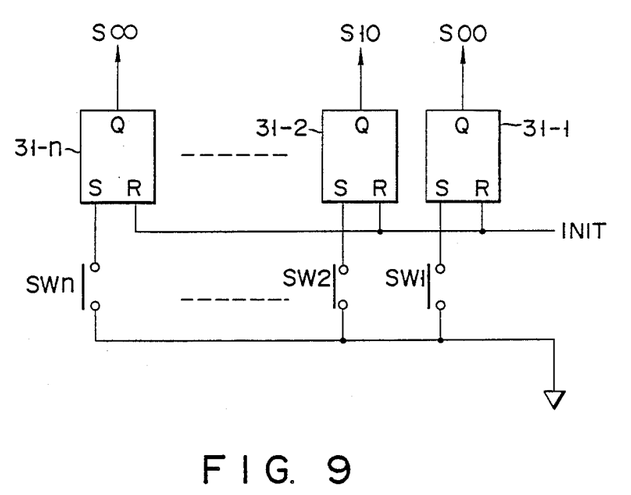
FIG. 9 is a circuit arrangement showing a flip-flop circuit array for controlling the analogue switch array of FIG. 8.

FIG. 9 shows another form of the analogue switch circuit and, in this case, the external volume switches SW1∼SWn are connected to the flip-flops in the shift register circuit. Control signals S00~S∞ are directly selected from the external volume switches and control the analogue switches 11-1~11-9 in the attenuator circuit.

According to the present invention, as set forth above, an attenuator circuit is provided which can suppress, for example, an unbalance of the frequency characteristic at a high frequency zone, without increasing a total resistive value of resistors, and can readily and accurately obtain an attenuation ratio.

What is claimed is:

1. An attenuator circuit comprising:
   an input node;
   a first resistor connected at one terminal to a reference potential;
   a second resistor connected in series with the other terminal of the first resistor;
   a first output node which is a connection node between the first resistor and the second resistor;
   a third resistor connected in parallel with the serial circuit of the first and second resistors, the third resistor being of such a type that a resultant resistive value of the parallel circuit of the first and second and third resistors is substantially equal to a resistive value of the first resistor;
   a fourth resistor connected at one terminal to a connection node of the second and third resistors and having a resistive value substantially equal to that of the second resistor;
   a second output node which is a connection node of the fourth resistor and the parallel circuit of resistors; and
   at least one combination resistor of a ladder configuration connected between the other terminal of the fourth resistor and the input node and having a third output node as a junction formed between said input node and, the combination resistor.

2. The attenuator circuit according to claim 1, further comprising switch means, connected to the third output nodes, for switchingly opening and closing an electric signal supplied to an output terminal connected to the switching means.

3. The attenuator circuit according to claim 2, further comprising logic circuit means, connected to receive control signals from an external source, for controlling said switch means in ON-OFF fashion.

4. The attenuator circuit according to claim 3, in which said logic circuit means includes a flip-flop circuit composed of a plurality of flip-flops; and a plurality of external switches, connected to the plurality of flip-flops, for setting the respective flip-flips.

5. The attenuator circuit according to claim 3, further including a shift register circuit composed of a plurality of flip-flop.

6. The attenuator circuit according to claim 5, in which said logic circuit means is connected to receive a signal for instructing a shift direction of said shift register circuit.

7. The attenuator circuit according to claim 5, in which said logic circuit means receives a clock signal for shift-operating said shift register circuit.

8. The attenuator circuit according to claim 5, in which said logic circuit means receives a signal for instructing a shift direction of said shift register circuit.

9. The attenuator circuit according to claim 5, in which said shift register circuit is initialized by an initializing signal.

10. The attenuator circuit according to claim 1, further comprising a series circuit of resistors connected between said input node and said at least one combination resistor of the ladder configuration.

11. The attenuator circuit according to claim 10, further comprising switch means, connected to said third output node, for switching an electric current from an output terminal of said switch means.

12. The attenuator circuit according to claim 11, further comprising logic circuit means, connected to receive control signals from an external source, for controlling said switch means in ON-OFF fashion.

13. The attenuator circuit according to claim 12, in which said logic circuit means includes a flip-flop circuit composed of a plurality of flip-flops; and external switches, connected to said flip-flop circuit, for setting the respective flip-flop.

14. The attenuator circuit according to claim 12, in which said logic circuit means includes a shift register circuit composed of a plurality of flip-flops.

15. The attenuator circuit according to claim 14, in which said shift register circuit is initialized by an initializing signal.

16. The attenuator circuit according to claim 14, in which said logic circuit means is connected to receive a clock signal for shift-operating said shift register circuit.

17. The attenuator circuit comprising:
   an input node;
   a first resistor connected at one terminal to a reference potential;
   a second resistor connected in series with the other terminal of the first resistor;
   a first output node which is a connection node of said first resistor and said second resistor;
   a third resistor connected in parallel with the series circuit of said first and second resistors, said third resistor being of such a type that a resultant resistive value of the parallel circuit of resistors is substantially equal to a resistive value of the first resistor;
   a fourth resistor connected at one terminal to a connection node of the second resistor and third resistor and having a resistive value substantially equal to that of the second resistor;
   a second output node connected to a connection node of the fourth resistor and the parallel circuit of resistors;
   at least one combination resistor of a ladder configuration connected between the other terminal of the fourth resistor and the input node and having a third node as a junction formed between said input node and the combination resistor;
   switch means connected to the third output node, for switchingly opening and closing an electric signal;
   an output terminal connected to the switch means;
   logic circuit means, connected to receive control signal from an external source, for controlling the switch means in ON-OFF fashion; and
   a plurality of series-connected resistors connected between the input node and the at least one combination resistor of a ladder configuration.

* * * * *